United States Patent [19]

Chai

[11] Patent Number: 5,030,613

[45] Date of Patent: Jul. 9, 1991

[54] EPITAXIAL BA—Y—CU—O CERAMIC SUPERCONDUCTOR FILM ON PEROVSKITE STRUCTURE SUBSTRATE

[75] Inventor: Bruce H. Chai, Bridgewater, N.J.

[73] Assignee: Allied-Signal Inc., Morris Township, Morris County, N.J.

[21] Appl. No.: 232,046

[22] Filed: Aug. 15, 1988

[51] Int. Cl.$^5$ ............................................. B32B 9/00
[52] U.S. Cl. ..................................... 505/1; 505/701; 505/702; 505/703; 505/704; 428/697; 428/688; 428/701; 428/702; 428/910; 428/930; 156/610; 204/192.24
[58] Field of Search ............ 505/1, 731, 741, 701–704; 156/610; 29/599; 428/688, 930, 697, 701, 702, 910; 204/192.24

[56] References Cited

PUBLICATIONS

Chem. Abs., CA 110(6):49431v, Sandstrom et al.
Appl. Phys. Lett. 51, 852 (1987), Oh et al., "Critical Current Densities and Transport in Superconducting YBa$_2$Cu$_3$O$_{7-\delta}$ Films Made By . . . etc."
Phys. Rev. Lett. 58, 908 (1987), Wu et al., "Superconductivity at 93 K in a New Mixed-Phase Y—Ba—Cu—O Compound System at Ambient Pressure".
Appl. Phys. Lett. 52, 2077 (1988), A. Gupta et al., "Superconducting Oxide Films with High Transition Temperature Prepared from . . . etc."
Appl. Phys. Lett. 52, 2072 (1988), M. D. Kirk et al., "Scanning Tunneling Microscopy of the a-b Planes of Bi$_2$(Ca,Sr)$_3$Cu$_2$O$_{8+\delta}$ Single Crystal . . . etc."
Appl. Phys. Lett. 52, 2068 (1988), A. Mogro-Campero et al., "Characterization of Thin Films of Y—B—Cu—O on Oxidized Silicon with . . . etc."
Appl. Phys. Lett. 52, 1992 (1988), B. T. Sullivan et al., "Bi—Sr—Ca—Cu—Oxide Superconducting Thin Films Deposited by dc Magnetron Sputtering".
Appl. Phys. Lett. 52, 1987 (1988), R. P. Gupta et al., "Y—B—Cu—O Superconducting Film on Oxidized Silicon".
Appl. Phys. Lett. 52, 1904 (1988), J. W. C. DeVries et al., "Preparation, Patterning, and Properties of Thin YBa2Cu3O$_{7-\delta}$Films".
J. Cryst, Growth 85, 615 (1987), R. L. Henry et al., "Thin Film Growth of YBa$_2$Cu$_3$O$_x$ From Nitrate Solutions".
J. Cryst, Growth 85, 619 (1987), A. S. Edelstein et al., "Formation of the Structure of the Superconducting Phase of La—Sr—Cu—O by DC Sputtering".
Appl. Phys. Lett. 51, 861 (1987), X. D. Wu et al., "Epitaxial Ordering of Oxide Superconductor Thin Films on (100) SrTiO$_3$ Prepared by . . . etc."
Appl. Phys. Lett. 52, 1834 (1988), D. M. Hwang et al., "Transmission Electron Microscopy Studies of Superconducting Y—Ba—Cu—O Films Prepared by . . . etc."
Appl. Phys. Lett. 51, 1194 (1987), S. J. Lee et al., "Preparation of Y—Ba—Cu—O Thin Films on M$_g$O by dc Magnetron Sputtering from . . . etc."
J. Phys. 21, 10 (k1988), Zh Qi et al., "An Investigation of the Film Growth of Y—Ba—Cu—O by DC Magnetron Sputtering".
Appl. Phys. Lett. 53, 156 (1988), S. A. Kramer et al., "Highly Oriented Superconducting Thin Films Derived From the Sol-Gel Process".
J. Appl. Phys. 60, 1640 (1986), R. Fischer et al., "Material Properties of High Quality GaAs Epitaxial Layers Grown on Si Substrates".

*Primary Examiner*—Patrick Ryan
*Attorney, Agent, or Firm*—Gerhard H. Fuchs; Richard C. Stewart; Ernest D. Buff

[57] ABSTRACT

Superconducting Ba—Y—Cu—O ceramic thin film is epitaxially deposited on a crystal substrate of LaAlO$_3$, LaGaO$_3$, PrGaO$_3$ and NdGaO$_3$.

11 Claims, No Drawings

EPITAXIAL BA—Y—CU—O CERAMIC SUPERCONDUCTOR FILM ON PEROVSKITE STRUCTURE SUBSTRATE

BACKGROUND OF THE INVENTION AND THE PRIOR ART

Suggested applications of the recently discovered superconducting compounds, including superconducting ceramics composed of Ba—Y—Cu—O, include microelectronics. In such applications, thin films of the superconductor would provide electronic circuits. Prior efforts to provide a Ba—Y—Cu—O thin film superconductor include deposition thereof, by various means, onto crystalline substrates such as Si, GaAs, MgO, $Al_2O_3$, $BaTiO_3$, $(BaSr)TiO_3$, $SrTiO_3$, $ZrO_2$, glass and others. Although these deposited thin films were in some cases superconducting at liquid nitrogen temperature, none were truly epitaxial; all were polycrystalline. Depending on the method of preparation, the grain size in these polycrystalline films may vary from a few hundredth of a micron to several micron. The reason for polycrystalline film formation on these substrates is found in lattice mismatch between substrate and film. Among the substrates reported so far, $SrTiO_3$ has the closest lattice match (a=b=3.905 Å) to $Ba_2YCu_3O_{7-x}$ (a=3.824 Å, b=3.884 Å). Indeed, film grown on $SrTiO_3$ had the best orientation and showed the highest critical current density of $10^5$ $A/cm^2$ at 77K, and $10^6$ $A/cm^2$ at 4.2K (Oh et al., Appl. Phys. Lett. 51, 852 (1987)).

Grain boundaries in thin film superconductors are undesirable because they limit the performance of the material and introduce processing difficulties of making fine circuit patterns.

It is an object of the present invention to provide crystal substrates for epitaxial deposition of thin film Ba—Y—Cu—O type superconductors which provide sufficiently close lattice match between substrate and film.

SUMMARY OF THE INVENTION

I have found that certain perovskite structure compounds, namely lanthanum aluminate and certain rare earth gallates, provide reasonably close lattice match with the Ba—Y—Cu—O type superconductors, sufficient to permit epitaxial deposition. In accordance with the present invention, there is provided a superconducting structure comprising, in combination, a crystal substrate having a superconducting film epitaxially deposited thereon, wherein the substrate is a crystal selected from the group consisting of $LaAlO_3$, $LaGaO_3$, $PrGaO_3$ and $NdGaO_3$, and where the superconducting film is a Ba—Y—Cu—O type superconductor, typically $Ba_2YCu_3O_{7-x}$ where x is from about 0.1 to about 0.5.

DETAILED DESCRIPTION OF THE INVENTION, OF THE PREFERRED EMBODIMENTS, AND OF THE BEST MODE PRESENTLY CONTEMPLATED FOR ITS PRACTICE

In order to obtain epitaxial film growth on crystalline substrates, reasonably close match of lattice dimensions between film and substrate is required. Thicker films (>1 μm) especially require better match than thinner films. Typically, lattice mismatch should not be more than about 0.5 percent; preferably it is less than about 0.1 percent. Since the epitaxially deposited thin film is normally much thinner than the substrate, the tolerance under compression (substrate lattice smaller than the film lattice) is about twice that under tension. As can be seen from the data above, in the case of Ba—Y—Cu—O on $SrTiO_3$, the Ba—Y—Cu—O film is under tension in both the a and b direction. The mismatch is −0.081 Å (or −2.12 percent) in the "a" direction, and −0.021 Å (or −0.54 percent) in the "b" direction. This mismatch results in excessive tension which tends to break up the film into isolated islands.

Furthermore, the substrate material should not contain magnetic ions, such as Cr, Mn, Fe, Co or Ni, nor magnetic rare earth ions because these can have an adverse effect on the superconducting properties of the thin film (reduction of Tc due to splitting of Cooper pairs).

The substrate crystals employed in the superconducting structures of the present invention are of the perovskite type. Perovskites have an essentially cubic structure, and have the general composition $A^{3+}B^{3+}O_3$, where A and B represent cations of different size. Since a wide range of metals are capable of entering this structure, and since a multitude of A-B combination are possible, the number of perovskite structure compounds is prodigious. I have found that certain perovskite structure compounds provide suitable substrates for epitaxial growth of Ba—Y—Cu—O type superconductors. These, and their lattice dimensions and magnetic susceptibility, are listed in the table below. The perovskite lattice dimensions are based on a pseudo-cubic cell dimension. The orientation for film deposition can be either the (001) or the (100) plane, since they are crystallographically identical. They corresponds to the (110) plane in the regular orthorhombic cell orientation. The cell dimensions are obtained from Marezio et al., Inorganic Chemistry V. 7, No. 7, p. 1337 (1968).

TABLE 1

| Compound | $a_0$ Å | $(a_0 − b)/b\%$ | $b_0$ Å | $(b_0 − a)/a\%$ | magnetic susceptibility or rare earth ion $10^{-6}$ cgs units |
|---|---|---|---|---|---|
| $LaGaO_3$ | 3.888 | −0.10 | 3.884 | −1.57% | −78 |
| $PrGaO_3$ | 3.871 | +0.33 | 3.866 | −1.10 | +8994 |
| $NdGaO_3$ | 3.865— | +0.49 | 3.855 | −0.81 | +10200 |
| $LaAlO_3$ | 3.790 | +2.42 | 3.790 | +0.89 | −78 |

Notes:
here a + 3.824 Å
b + 3.884 Å
(+) sign - film under compression
(−) sign - film under tension Of these, $LaAl_3$ and $LaGaO_3$ are preferred.

The substrate crystals are prepared in conventional manner by mixing the oxide components in stoichiometric ratio, and heating the mixture in an appropriate furnace—e.g. a furnace equipped with R.F. heating coils—at temperature and for time sufficient to melt the charge, followed by slow cooling to form the crystal phase.

The oxide component raw materials should be of high purity, desirably at least about 99.99% purity. Their particle size is not critical, although fine powder form will aid in intimate mixing of the components, and facilitate initiation of the reaction. Once melting occurs, the reaction is reasonably fast, regardless of the particle size. No agitation is needed, and the heating rate is not a critical parameter. Melting of the oxides is desirably conducted in iridium vessels, in a low oxygen environment (less than about 1 vol. percent $O_2$). The gallate compounds have melting points in the order of between about 1700° C. to 1800° C.; the $LaAlO_3$ has a much higher melting temperature in the order of about 2100° C. Once the melt is formed, it is held for a while at a temperature above melt temperature to permit completion of the reaction and to homogenize the melt composition. Thereafter the melt is permitted to cool at a rate in the order of about 1° to 2° C./min. Cooling may take place in the melt crucible, in which case the melt freezes to form large grains, which then can be removed from the crucible and separated into single crystals. These crystals are then oriented in the desired plane, sliced and polished to provide substrates of the proper orientation.

To obtain larger substrates as are required for superconducting devices, it will ordinarily be desirable to conduct the crystal growth by the well known Czochralski process, which produces single crystal boules, which are then oriented in the usual manner, sliced and polished to provide substrate surfaces for deposition of the superconducting thin film.

Another method for growing the substrates for the superconductor structures of the present invention is the method which has become known as the "Tyco" method (LaBelle et al., "Growth of Controlled Profile Crystal from the Melt: Part I Sapphire Filaments", Mat. Res. Bull. 6 (1971) 571–580). That method employs a shaped capillary orifice, e.g. a tubular, annular, or ribbon-shaped capillary orifice to maintain the liquid level constant during crystal growth and to determine the shape of the growing crystal. In that process, in essence, the melt is "pulled" from the outlet of the shaped orifice into which it is raised through capillary action, to solidify into a single crystal of predetermined shape. The product crystal cross-section is determined by the shape of the orifice. The resultant product being a single crystal, it is eminently suited for deposition thereon of the Ba—Y—Cu—O superconductor to obtain a superconducting structure of the present invention.

The Ba—Y—Cu—O type superconductors are known, as is their preparation. They have first been reported by Wu et al. (Phys. Rev. Lett. 58, 908 (1987)).

Ba—Y—Cu—O superconductors have been applied by various methods as thin films onto a number of different substrates, including Si, GaAs, MgO, $Al_2O_3$, $ZrO_2$, $BaTiO_3$, $(BaSr)Ti_3$, $SrTiO_3$ and glass. These methods involved different deposition techniques for coating an oxidizable Ba, Y and Cu containing layer onto the surface of the substrate, generally followed by an oxidizing anneal. Any of these known methods may be used to deposit the Ba—Y—Cu—O type ceramic onto the substrates contemplated by the present invention to obtain the new epitaxial superconducting structures. These methods include: application of metal trifluoroacetate spin-on precursors (Appl. Phys. Lett. 52, 2077 (1988); electron beam co-evaporation of the metals (Appl. Phys. Lett. 52, 2072 (1988); multi-layer evaporation process (Appl. Phys. Lett. 52, 2068 (1988); dc magnetron sputtering (Appl. Phys. Lett. 52, 1992 (1988); painting finely ground superconducting pellets suspended in binder on the substrate, followed by annealing in oxygen (Appl. Phys. Lett. 52, 1987 (1988)); triode sputtering (Appl. Phys Lett. 52, 1904 (1988); application of nitrate solutions of the metals, followed by drying and oxidizing sintering (J. Cryst. Growth 85, 615 (1987)); reactive magnetron sputtering (J. Cryst. Growth 85, 619 (1987)); eximer laser evaporation and deposition (Appl. Phys. Lett. 51, 861 (1987), and Appl. Phys. Lett. 52, 1834 (1988)).

EXAMPLE 1

Preparation of $LaGaO_3$ substrate

The starting materials are equal molar amount of $La_2O_3$ and $Ga_2O_3$ powders of 99.99% purity. A total of 325.8 grams of $La_2O_3$ and 187.5 grams of $Ga_2O_3$ are mixed and placed in an 7.5 cm diameter iridium crucible inside an nitrogen purged chamber to prevent oxidation of Ir crucible, and are heated by an RF heating coil. The $LaGaO_3$ melts at 1780° C. The melt is left to soak at temperature slightly higher than melting temperature for a couple of hours to facilitate the reaction and to homogenize the melt composition. $LaGaO_3$ seed is dipped into the melt and the $LaGaO_3$ crystal is grown by the Czochralski pulling technique. Typical pulling rate is about 1 to 3 mm per hour and seed rotation rate is about 15 rpm. As the growth is completed the crystal is separated from the melt and cooled slowly to prevent cracking. The as grown crystal is then oriented by Laue x-ray photograph technique on an goniometer head. The substrate orientation is (001) of the pseudo-cubic cell or the (110) of the orthorhombic cell orientation. The crystal boule is then sliced and polished to produce substrate wafers.

EXAMPLE 2

Deposition of thin film Ba—Y—Cu—O onto an $LaGaO_3$ substrate by DC magnetron sputtering A stoichiometric $YBa_2Cu_3O_{7-x}$ disk prepared by a standard sintering process (sintered at 900° C. followed by slow cooling in oxygen atmosphere) is used as target. A cleaned $LaGaO_3$ substrate is used for deposition. The sputtering chamber is pre-pumped to $10^{-6}$ Pa and 1 Pa oxygen is introduced in the chamber mixed with argon with a total 5 Pa pressure. Sputtering is achieved with voltage of 200 V and current of 0.4A. The deposited film is subsequently annealed for 1 min at 900° C. in oxygen. Ref: S. J. Lee, et al., Appl. Phys. Lett. 51, 1194 (1987). Z. Qi, et al., J. Phys. 21, 1040 (1988).

EXAMPLE 3

Preparation of $LaAlO_3$ substrate

The starting materials are equal molar amounts of $La_2O_3$ and $Al_2O_3$ powders of 99.99% purity. A total of 325.8 grams of $La_2O_3$ and 102.0 grams of $Al_2O_3$ are employed. The as grown crystal is oriented by Laue x-ray photograph technique on an goniometer head. The substrate orientation is (01.2) face of the rhombohedral cell or (001) face of the pseudo-orthorhombic cell. The crystal boule is then sliced and polished to produce substrate wafers.

EXAMPLE 4

Deposition of Ba—Y—Cu—O Superconductors thin film by sol-gel process $YBa_2Cu_3O_{7-x}$ thin film is prepared by spin casting the partially hydrolyzed stock solution onto a single crystal substrate of $LaAlO_3$. The stock solution is a mixture of copper (II) ethoxide/toulene suspension with Ba-methoxyethoxide and Y-methoxythoxide in the Y:1, Ba:2, Cu:3 molar ratio. The resulting film (about 1000 Å in thickness) is then dried in an oven and fired in a flow of oxygen at 850° C. for about 30 minutes. It then cools slowly (100° C./hr) to room temperature. Ref: S. A. Kramer et al., Apply. Phys. Lett. 53, 156 (1988).

Lattice matching can be greatly improved by cutting the substrate in the form of a wafer tilted relative to the (001) plane. The Ba—Y—Cu—O superconductor compound is orthorhombic in symmetry with $a=3.824$ Å and $b=3.884$ Å. Tilting therefor is only applicable to substrates having dimensions smaller than 3.884 Å. Moreover, for practical purposes, a single tilt is recommended for ease of orientation, and because double tilting will generate undesirable twisting deformation. The expedient of using tilted cuts to accommodate lattice mismatch has previously been resorted to for growing GaAs epitaxial layers on Si substrates (Fisher et al., J. Appl. Phys. 60, 1640 (1986). The optimum tilt angles relative to the (001) plane in the b direction for the substrates used for making the superconducting structures of the present invention are listed in Table 2 below:

TABLE 2

| Substrate | "b" direction |
|---|---|
| $LaAlO_3$ | 12.6° ± .5° |
| $LaGaO_3$ | none |
| $PrGaO_3$ | 4.7° ± .5° |
| $NdGaO_3$ | 5.7° ± .5° |

Therefore, $LaGaO_3$ is a substrate without the requirement for tilting since the film is under tension in both directions. $LaAlO_3$ is desirably used tilted 12.6±0.5° in the "b" direction.

Since various changes and modifications may be made in the invention without departing from its spirit and essential characteristics, it is intended that all matter contained in the description shall be interpreted as illustrative only and not in a limiting sense, the scope of the invention being defined by the appended claims.

I claim:

1. A superconducting structure comprising, in combination, a crystal substrate having a superconducting film epitaxially deposited thereon, wherein the substrate is a crystal selected from the group consisting of $LaAlO_3$, $LaGaO_3$, $PrGaO_3$ and $NdGaO_3$, and wherein the superconducting film is a Ba—Y—Cu—O superconductor.

2. The structure of claim 1 wherein the substrate is a crystal of $LaAlO_3$ or $LaGaO_3$.

3. The structure of claim 1 wherein the substrate is $LaGaO_3$.

4. The structure of claim 1 wherein the Ba—Y—Cu—O superconductor has the composition $Ba_2YCu_3O_{7-x}$ where x is from about 0.1 to about 0.5.

5. The structure of claim 5 wherein the substrate is a crystal of $LaAlO_3$ or $LaGaO_3$.

6. The structure of claim 4 wherein the Ba—Y—Cu—O superconductor is deposited by sputtering procedure.

7. The structure of claim 6 wherein the substrate is in the (001) orientation of the pseudo-cubic cell or (110) orientation of the orthorhombic cell.

8. The structure of claim 7 wherein the substrate has been obtained by the Czochralski process.

9. The structure of claim 8 wherein the substrate is $LaAlO_3$.

10. The structure of claim 8 wherein the substrate is $LaGaO_3$.

11. The structure of claim 1 wherein the substrate is a crystal of $LaAlO_3$ and wherein the surface whereon the superconductor is deposited is tilted 12.6°±0.5° in the "b" direction.

* * * * *